(12) United States Patent
Boniardi et al.

(10) Patent No.: US 9,520,190 B2
(45) Date of Patent: Dec. 13, 2016

(54) MODIFIED RESET STATE FOR ENHANCED READ MARGIN OF PHASE CHANGE MEMORY

(71) Applicant: MICRON TECHNOLOGY, INC., Boise, ID (US)

(72) Inventors: Mattia Boniardi, Milan (IT); Andrea Redaelli, Calolziocorte (IT); Fabio Pellizzer, Boise, ID (US); Daniele Ielmini, Bergamo (IT); Agostino Pirovano, Milan (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 14/563,731

(22) Filed: Dec. 8, 2014

(65) Prior Publication Data

US 2015/0092483 A1    Apr. 2, 2015

Related U.S. Application Data

(63) Continuation of application No. 13/512,006, filed as application No. PCT/IT2009/000572 on Dec. 18, 2009, now Pat. No. 8,908,414.

(51) Int. Cl.
*G11C 11/00* (2006.01)
*G11C 13/00* (2006.01)

(52) U.S. Cl.
CPC ....... *G11C 13/0069* (2013.01); *G11C 13/0004* (2013.01); *G11C 13/0064* (2013.01); *G11C 13/0097* (2013.01); *G11C 2013/009* (2013.01); *G11C 2013/0092* (2013.01)

(58) Field of Classification Search
CPC ............ G11C 13/0004; G11C 13/0069; G11C 11/5678; G11C 7/222
USPC .......................................... 365/148
See application file for complete search history.

(56) References Cited

U.S. PATENT DOCUMENTS

| | | | |
|---|---|---|---|
| 2006/0091373 A1 | 5/2006 | Lee et al. | |
| 2006/0181922 A1 | 8/2006 | Dodge et al. | |
| 2006/0274574 A1 | 12/2006 | Choi et al. | |
| 2008/0025068 A1* | 1/2008 | Scheuerlein | G11C 17/165 365/148 |
| 2008/0025078 A1* | 1/2008 | Scheuerlein | G11C 5/02 365/163 |
| 2008/0151612 A1 | 6/2008 | Pellizzer et al. | |
| 2008/0219040 A1* | 9/2008 | Philipp | G11C 11/5678 365/148 |
| 2009/0040816 A1* | 2/2009 | Kang | G11C 13/0004 365/163 |
| 2009/0040817 A1* | 2/2009 | Kang | G11C 11/56 365/163 |

(Continued)

FOREIGN PATENT DOCUMENTS

WO    WO 2007-075392    7/2007

OTHER PUBLICATIONS

International Search Report mailed Jul. 2, 2010 in corresponding International Application No. PCT/IT2009/000572.

(Continued)

*Primary Examiner* — Anthan Tran
(74) *Attorney, Agent, or Firm* — Holland & Hart LLP

(57) ABSTRACT

Subject matter disclosed herein relates to techniques involving a structural relaxation (SR) phenomenon for increasing resistance of a Reset state of phase change memory.

20 Claims, 8 Drawing Sheets

(56) References Cited

U.S. PATENT DOCUMENTS

2009/0231912 A1   9/2009  Liu
2010/0165725 A1   7/2010  Bedeschi

OTHER PUBLICATIONS

Written Opinion mailed Jul. 2, 2010 in corresponding International Application No. PCT/IT2009/000572.

* cited by examiner

MODIFIED RESET STATE FOR ENHANCED READ MARGIN OF PHASE CHANGE MEMORY

REFERENCE TO RELATED APPLICATIONS

Any and all applications for which a foreign or domestic priority claim is identified in the Application Data Sheet as filed with the present application are hereby incorporated by reference under 37 CFR 1.57.

BACKGROUND

Field

Subject matter disclosed herein relates to techniques involving a structural relaxation (SR) phenomenon for establishing an increased resistance of a reset state of phase change memory.

Information

Phase change memory (PCM) may operate based, at least in part, on behaviors and properties of one or more particular phase change materials, such as chalcogenide glass and/or germanium antimony telluride (GST), just to name a few examples. Crystalline and amorphous states of such materials have different electrical resistivities, thus presenting a basis by which information may be stored. The amorphous, high resistance state may represent a stored first binary state and the crystalline, low resistance state may represent a stored second binary state. Of course, such a binary representation of stored information is merely an example: PCM may also be used to store multiple memory states, represented by varying degrees of phase change material resistivity, for example.

Research on alternative phase-change materials having improved properties in terms of reliability and performance has led to studies of various alloys and compositions of a GeSbTe ternary diagram, for example. Though certain compositions may lead to such improved reliability and/or performance, a margin of resistance, or programming window, between set and reset states may be adversely reduced compared to margins of other phase-change materials. Such a reduced programming window may lead to a narrower readout margin between set and reset states. A PCM having a reduced programming window may experience a greater number of read errors compared to PCM having a larger programming window.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
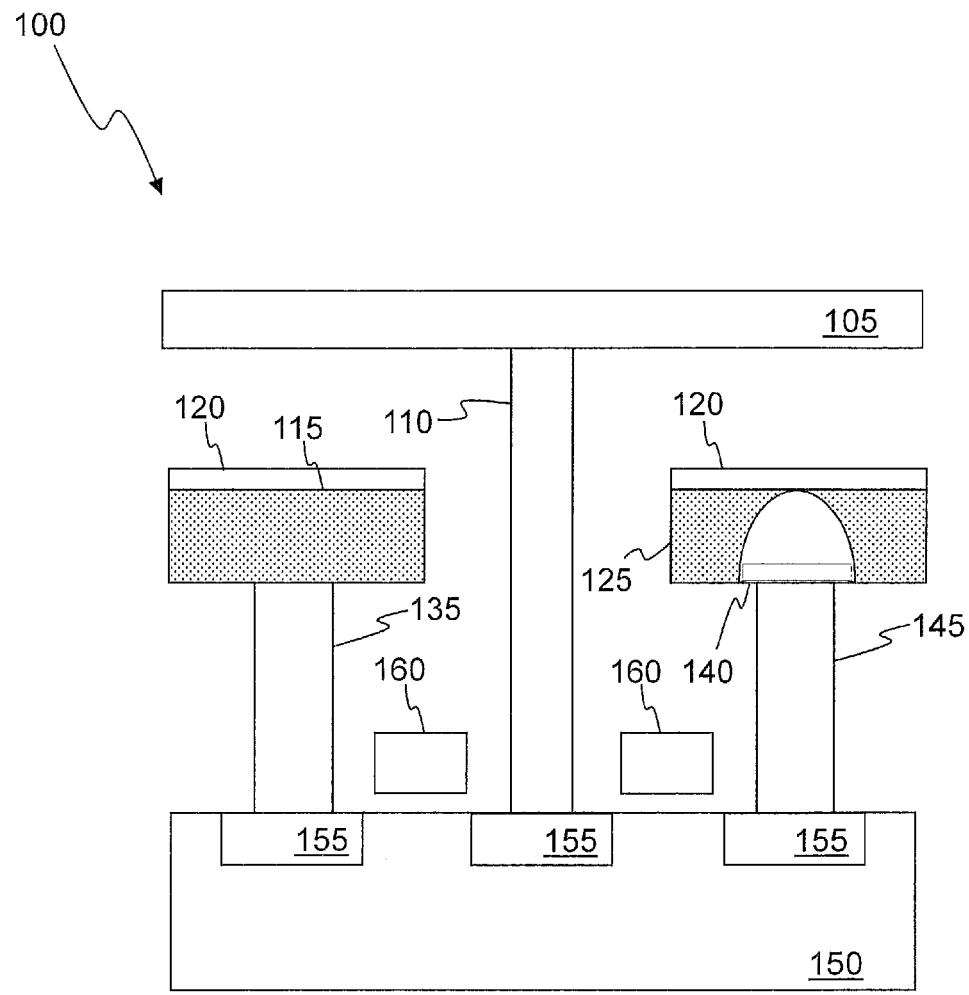
FIG. 1 is a schematic diagram of a portion of phase change memory, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a PCM cell may be reset by melting phase change material by applying a relatively high amplitude, relatively short duration electrical programming pulse. In contrast, a PCM cell may be set by applying a relatively smaller sub melt amplitude electrical programming pulse having a relatively longer duration, which may include a relatively abrupt drop, for example. A PCM cell may also be set by applying a higher—over melt amplitude electrical programming pulse, possibly having a gradual, sloping drop, to allow molten phase change material to organize its structure into a crystalline phase. Herein, such a reset and/or set pulse and process may be referred to as a "write" or "program" pulse and a "write" or "program" process.

In an embodiment, a memory cell programming process involving a structural relaxation (SR) phenomenon may lead to a desirable increased resistance of a reset state of a PCM cell. Such an increased resistance may in turn lead to a widening of a programming window between set and reset states of a PCM cell. SR may occur with materials in an amorphous state, for example. In such a state, a material may approach equilibrium through an arrangement of the material's molecular structure. For example, a phase change material may experience SR upon being cooled, heated, or maintained at a temperature below a transition temperature of the material. SR may be referred to as aging and/or annealing. Of course, such details of SR are merely examples, and claimed subject matter is not so limited.

In a particular implementation, SR of phase change material in a PCM cell may be realized by adding a trailing edge time (TET) to a duration of an electrical reset pulse, as explained in detail below. Adding such a TET may lead to shifting a reset state to a higher, enhanced resistance level compared to a reset state resulting from a reset pulse without an added TET. Accordingly, a readout margin between two states of a PCM may be desirably widened. Such an increased resistance may be a result of one or more physical mechanisms of SR in an amorphous phase of a chalcogenide material, for example. In particular, a reset pulse including an added TET may be able to accelerate SR within few hundreds of nanoseconds, for example, resulting in a higher value of resistance after a program pulse is applied. Of course, such details of an application of a modified reset pulse and resulting SR are merely examples, and claimed subject matter is not so limited.

FIG. 1 is a schematic diagram of a portion of phase change memory 100, according to an embodiment. Such a portion is shown to include two memory cells, each memory cell being in a different memory state for illustrative purposes. A semiconductor substrate 150 may include N-doped regions 155, though other configurations, including the use of P-doped regions for example, may be used. Phase change memory 100 may include word lines 160, bit line 105, and bit line contact 110. To represent one memory state, a heater 145 contacting a portion of phase change material 125 may heat to melt a portion 140 of phase change material 125, which may then be cooled relatively quickly to comprise amorphous GST, for example. Such an amorphous material may be relatively highly resistive, resulting in a high-resistance connection to a contact 120. To represent another memory state, a heater 135 contacting a portion of phase change material 115 may heat to melt a portion of phase change material 115, which may then be cooled relatively slowly to comprise a polycrystalline, low-resistance material. Such polycrystalline phase change material 115 may thus lead to a low-resistance connection to contact 120. Of course, details of such a portion of a PCM are merely examples, and claimed subject matter is not so limited.

As indicated above, phase change material portion 140 may be heated and subsequently cooled by a reset pulse modified by adding a TET, resulting in a reset state having an increased resistance. Accordingly, a difference in resistance between that of phase change material portion 140 (reset state) and polycrystalline phase change material 115 (set state) may be increased. Such an increase may improve a process of reading memory cells of a PCM since such a process may more easily discriminate between a reset and set state, for example.

Figure 2:
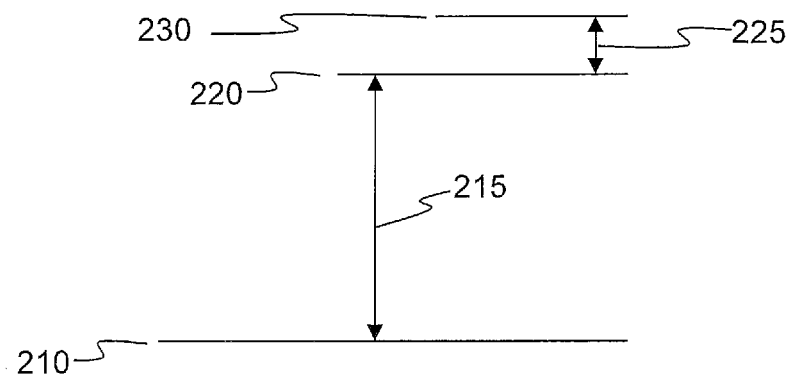
FIG. 2 is a state diagram showing possible transitions between and/or among resistance values corresponding to logic states of a PCM cell, according to an embodiment.

FIG. 2 is a state diagram showing possible transitions between and/or among resistance values corresponding to logic states of a PCM cell, according to an embodiment. For example, such a PCM cell may comprise a phase change material that may exist in an amorphous state having a relatively high resistance or a crystalline state having a relatively low resistance, as explained above. Transitions among such states may be initiated by applying an electrical pulse to a PCM cell to selectively melt, quench, and/or crystallize phase change material. Low resistance level 210 may correspond to a set state of a PCM cell, wherein phase change material is crystallized to have a relatively low resistance. High resistance level 220 may correspond to a reset state of a PCM cell, wherein phase change material is in an amorphous state to have a relatively high resistance. A difference in resistance values between low resistance level 210 and high resistance level 220 may correspond to a readout margin 215 between a low (set) and a high (reset) logic state of a PCM cell. Enhanced high resistance level 230 may correspond to a modified reset state of a PCM cell, wherein amorphous phase change material may be annealed via SR to increase resistance by a margin 225. Accordingly, readout margin 215 may be increased by margin 225, resulting in a widening of a programming window between set and reset states of a PCM cell.

Figure 3:
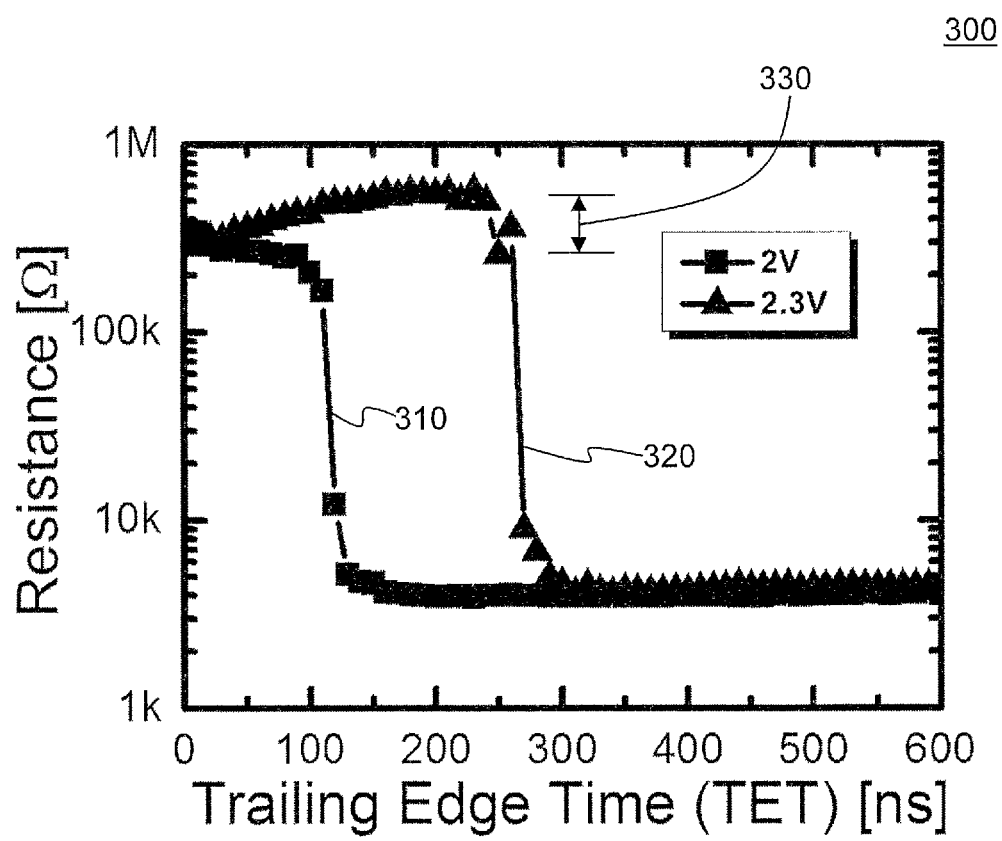
FIG. 3 is a plot of resistance of a memory cell versus trailing edge time (TET), according to an embodiment.

FIG. 3 is a plot 300 of resistance of a memory cell versus TET, according to an embodiment. Such a resistance may be depend, at least in part, on whether phase change material included in the memory cell, exists in an amorphous phase and/or a crystalline phase, as discussed above. Such a phase condition may be selected by adjusting a temperature of a heater element in the memory cell. For example, adjusting a value of an applied voltage and/or adjusting time duration of such an applied voltage may comprise a technique for selecting a particular phase condition of phase change material. In a particular implementation, TET may be added to the duration of a reset pulse to shift a reset state to a higher resistance level compared to a reset state resulting from a reset pulse without an added TET. Adding such a TET may comprise a technique for integrating temperature adjustment of phase change material in a reset pulse. Added TET acts to slowly switch off program current (voltage) during a reset pulse, and thus may slowly quench the phase change material. Accordingly, plot 300 comprises a plot of resistance versus such quenching time, starting from a TET of 10 nanoseconds (ns), which may correspond to a relatively fast quench, and continues to a TET of 600 ns. Data plot 310 comprises memory cell resistance versus TET for a reset pulse peak voltage of 2.0 volts. Data plot 320 comprises memory cell resistance versus TET for a reset pulse peak voltage of 2.3 volts. Differences between such data plots are explained below. Of course, the particular details of plot 300 are merely examples of how cell resistances may be determined for a particular implementation, and claimed subject matter is not so limited.

Referring to data plot 310, phase change material may exist in an amorphous state so that memory cell resistance may be relatively high for a reset pulse having a TET in a range from 10 ns to approximately 100 ns. Beyond a TET of approximately 120 ns, phase change material may exist in a crystalline state so that memory cell resistance may be relatively low (intermediate resistance may correspond to phase change material existing in a mixture of amorphous and crystalline states, for example). Such behavior of data plot 310 may be explained as follows. A relatively short TET (e.g., less than about 100 ns) added to a reset pulse may provide a sufficiently fast quenching of phase change material so that the phase change material remains in an amorphous state established at the onset of the reset pulse. On the other hand, a relatively long TET (e.g., greater than about 100 ns) added to the reset pulse may provide a sufficiently slow cooling of phase change material so that the phase change material crystallizes into a crystalline phase corresponding to a relatively low resistance. In fact, such a reset pulse with a relatively long TET may essentially comprise a set pulse, which may be used to initiate a transition of phase change material into a crystalline state.

In an embodiment, effects of SR may be introduced by sufficiently increasing the peak voltage of a reset pulse. In a particular example, such a voltage may be increased from 2.0 volts (e.g., data plot 310) to 2.3 volts, such as for data plot 320, which is described as follows. Referring to data plot 320, phase change material may exist in an amorphous state so that memory cell resistance may be relatively high for a reset pulse having a TET in a range from 10 ns to approximately 250 ns. Within this range, SR effects may be manifested as an increase of memory cell resistance as TET approaches approximately 250 ns. In particular, such an increase of resistance may lead to a modified reset state having an enhanced resistance compared to a case of not adding a TET (e.g., zero TET) and/or not sufficiently increasing the peak voltage of a reset pulse, for example. In other words, a resistance of a reset state of a memory cell may be increased by a margin 330 by adding a TET of about 200 ns and by sufficiently increasing the peak voltage of a reset pulse.

Continuing with data plot 320, beyond a TET of approximately 250 ns, phase change material may exist in a crystalline state so that memory cell resistance may be relatively low. As for the case of data plot 310, a relatively short TET (e.g., less than about 250 ns) added to a reset pulse may provide a sufficiently fast quenching of phase change material so that the phase change material remains in an amorphous state established at the onset of the reset pulse. On the other hand, a relatively long TET (e.g., greater than about 250 ns) added to the reset pulse may provide a sufficiently slow cooling of phase change material so that the phase change material crystallizes into a crystalline phase corresponding to a relatively low resistance. Accordingly, in order to benefit from an enhanced resistance, such as by margin 330, for example, a selection of TET may involve determining a desired TET that is long enough to enhance resistance (e.g., at a TET of 250 ns) but not so long that phase change material is allowed to crystallize (e.g., at a TET of 300 ns), leading to relatively low resistance. Of course, such values of peak voltage and TET are merely examples, and claimed subject matter is not so limited.

Figure 4:
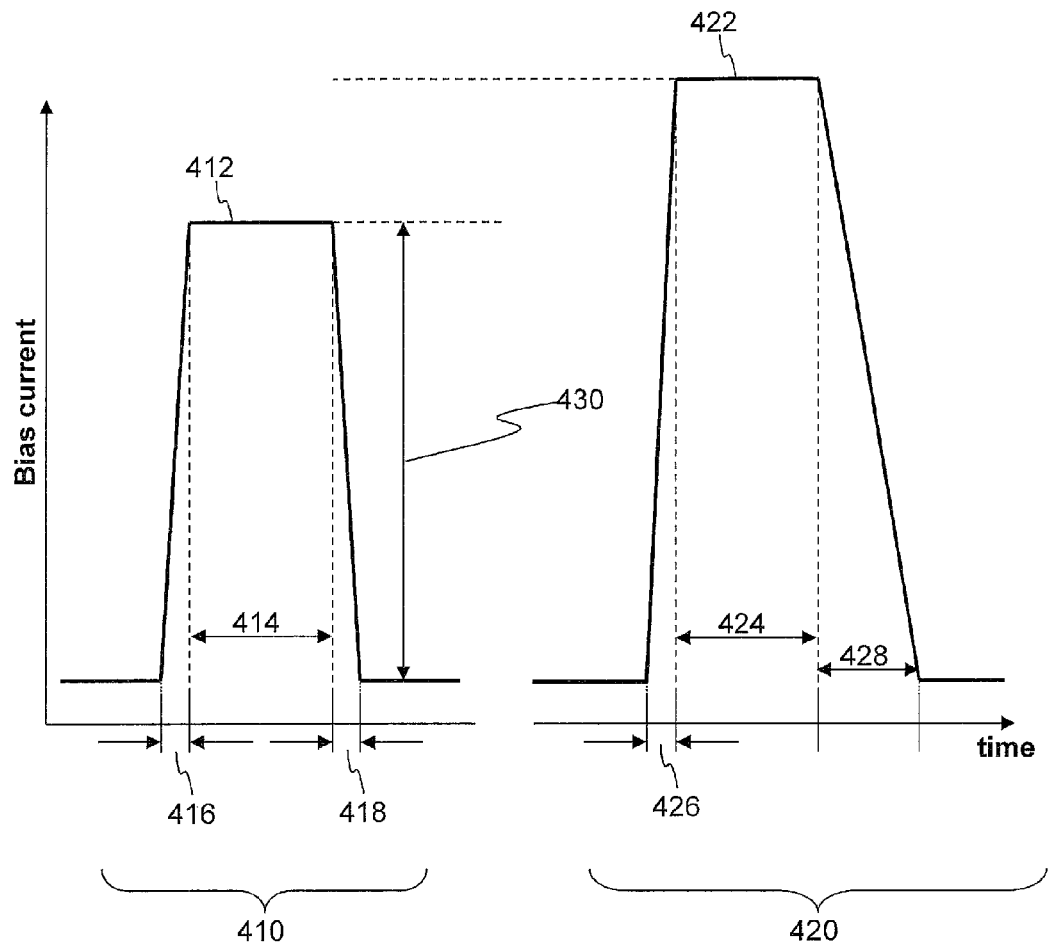
FIG. 4 is a plot of characteristics of a bias signal waveform, according to an embodiment.

FIG. 4 is a plot of characteristics of a bias signal waveform, according to an embodiment. For example, such a bias signal may comprise a reset pulse, as discussed above. In particular, reset pulse 410 comprises a rise time 416, fall time 418, width 414, and a peak current (voltage) value 412. Modified reset pulse 420 comprises a rise time 426, a fall time corresponding to a TET 428, width 424, and a peak current (voltage) value 422. Applying either reset pulse 410 or modified reset pulse 420 to a memory cell may lead to a high-resistance, amorphous state of phase change material included in the memory cell. However, applying modified reset pulse 420 to a memory cell may lead to an enhanced high-resistance, amorphous state of phase change material, compared to applying reset pulse 410. Compared to reset pulse 410, modified reset pulse 420 may include a lengthened TET 428 and a higher peak current (or peak voltage) 422. Such an increased TET and/or peak value may lead to an enhanced high-resistance resulting from SR, for example. To illustrate a particular example, peak current 422 may comprise 300 micro-amps compared to peak current 412 which may comprise 200 micro-amps. Of course, such values are merely examples, and claimed subject matter is not so limited.

Figure 5:
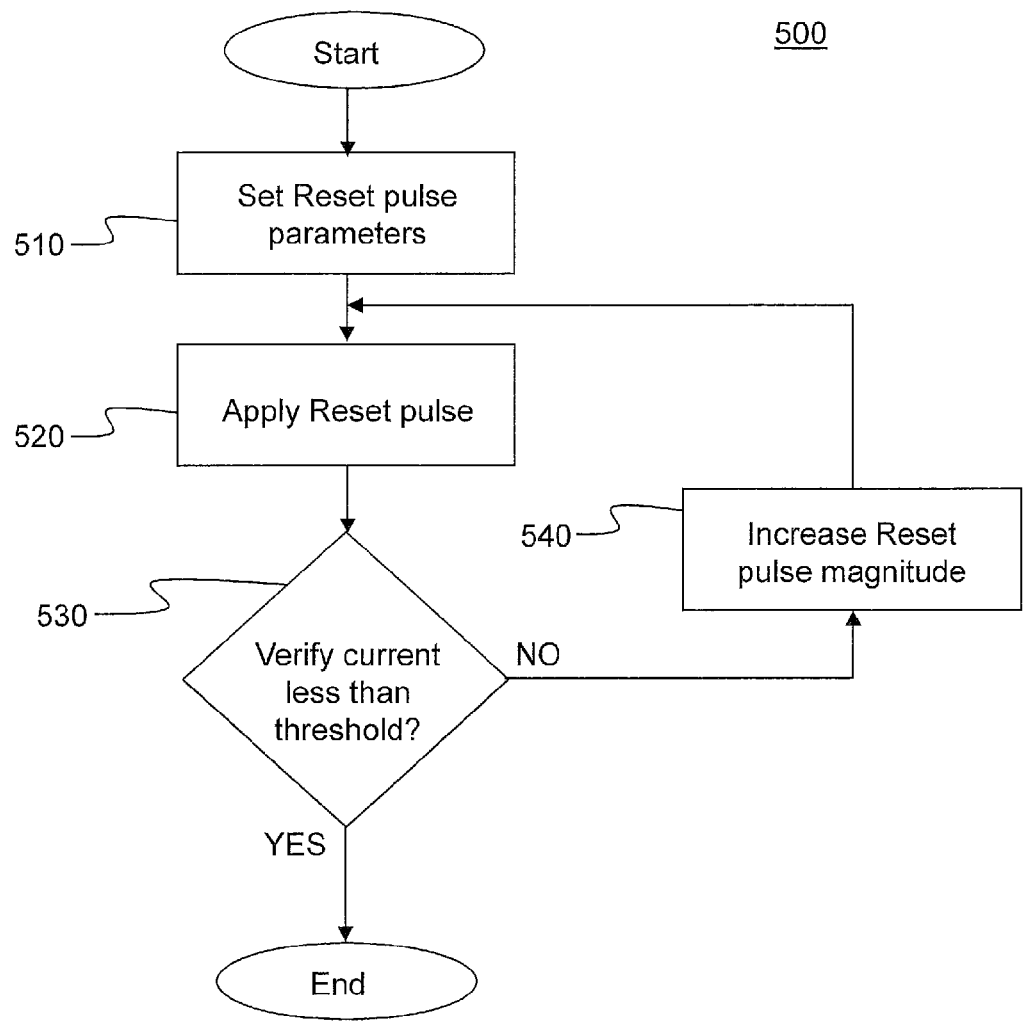
FIG. 5 is a flow diagram of a program-verify process, according to an embodiment.

FIG. 5 is a flow diagram of a program-verify process 500 to write a particular bit of information to a memory cell, according to an embodiment. Such a process may comprise a process to verify that such a particular bit was successfully written to the memory cell. In one implementation, such a particular bit may comprise a "zero" or reset bit. Here, a reset pulse may be applied to a memory cell to melt and subsequently quench phase change material in the memory cell so that the phase change material has a relatively high resistance. Accordingly, a verify process may include a technique to verify that phase change material was reset to such a high resistance subsequent to application of a reset pulse.

At block 510, parameters of a reset pulse to be applied to a particular memory cell may be established. For example, such parameters may comprise a value of peak current of a reset pulse, a width of a reset pulse, and/or rise and fall times of a reset pulse. In a particular implementation, for example, a reset pulse may include a peak current of 150 micro-amps and a fall time of 10 ns for one memory cell, while a reset pulse for another memory cell may include a peak current of 200 micro-amps and a fall time of 10 ns. However, these are merely examples of reset pulse parameters, and claimed subject matter is not limited in this respect. At block 520, a reset pulse having parameters determined at block 510 may be applied to a memory cell to write a "zero" bit to the memory cell, corresponding to a high-resistance state. In one implementation, such a "zero" bit stored in a memory cell may lead to a relatively low verify current as a result of applying a verify voltage across the memory cell, for example. In such a fashion, whether a "zero" bit was successfully written to the memory cell may be confirmed by determining whether or not a verify current is less than a particular threshold current value. Such a determination may be performed at diamond 530. If a verify current is less than such a particular threshold current, then process 500 may end, since storage of a "zero" bit, corresponding to a relatively high resistance, amorphous state of the memory cell is verified. However, if a verify current is more than such a particular threshold current, then storage of a "zero" bit may have failed, since a higher-than-desired verify current may indicate that the resistance of the memory cell was not reset to a sufficiently high value. Such a case may occur, for example, if phase change material in the memory cell is in a mixture of an amorphous state and a crystalline state. Thus, process 500 may proceed to block 540 where the magnitude of a reset pulse to be applied again (at block 520) to the memory cell may be increased. Such an increase may be sufficient to reset phase change material of the memory cell to a sufficiently high-resistance state. If so, then process 500 may end. Otherwise, if resistance of the memory cell is still not sufficiently high, then process 500 may again proceed to block 540 and the magnitude of a reset pulse may be increased further. Such a cycle may continue until a verify current is less than a threshold current, thus indicating that resistance of the memory cell is sufficiently high. Of course, such details of process 500 are merely examples, and claimed subject matter is not so limited.

Figure 6:
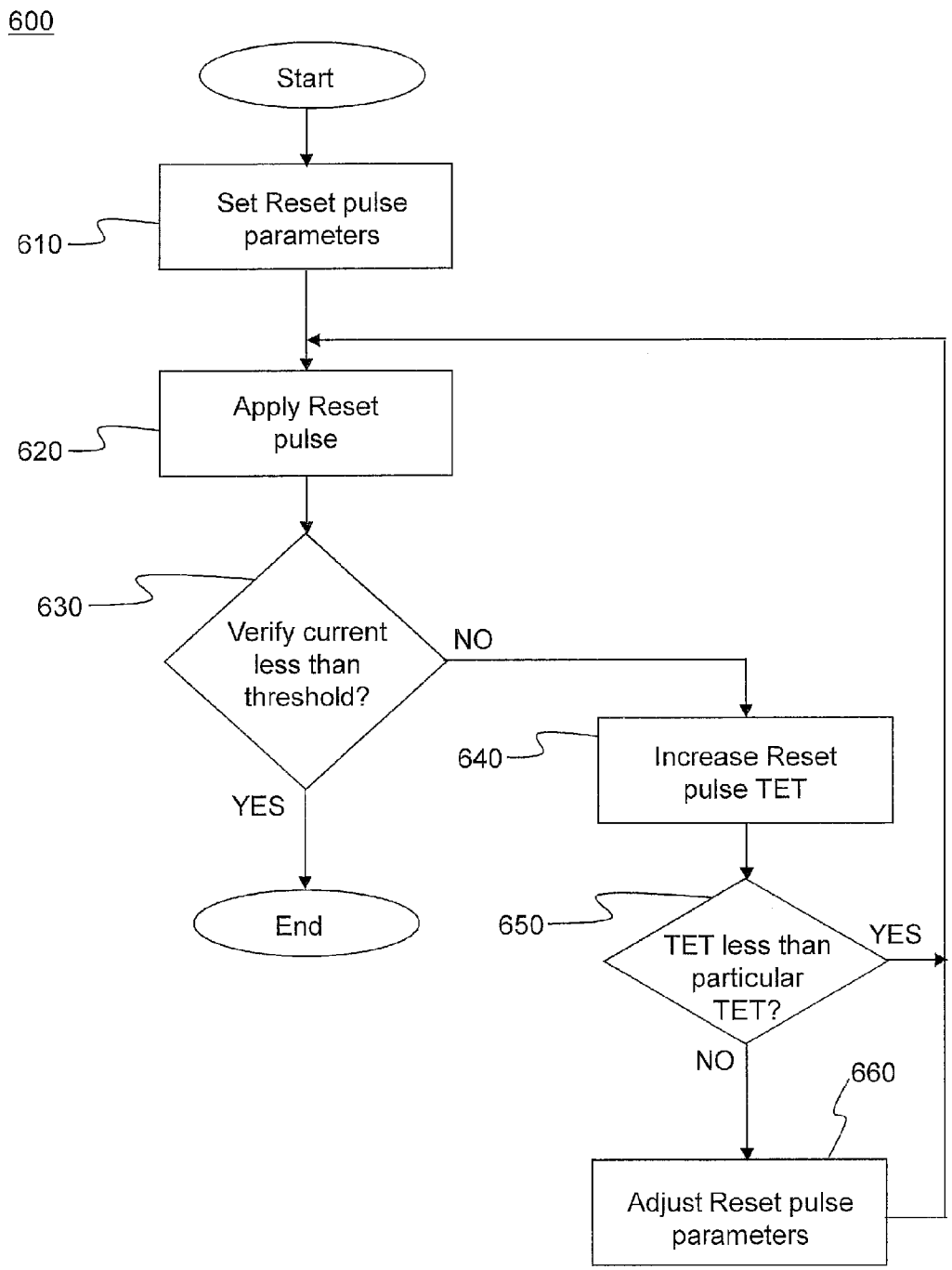
FIG. 6 is a flow diagram of a program-verify process, according to another embodiment.

FIG. 6 is a flow diagram of a program-verify process 600 to write a particular bit of information to a memory cell, according to another embodiment. Such a process may comprise a process to verify that such a particular bit was successfully written to the memory cell. In one implementation, such a particular bit may comprise a "zero" or reset bit. Here, a reset pulse may be applied to a memory cell to melt and subsequently quench phase change material in the memory cell so that the phase change material has a relatively high resistance. In a particular implementation, such a high resistance may comprise a resistance margin, such as margin 330 shown in FIG. 3, as a result of applying a modified reset pulse that allows SR to occur, for example. Accordingly, a verify process may include a technique to verify that phase change material was reset to such a high resistance subsequent to application of a modified reset pulse. Such a modified reset pulse may include an added TET, as described above.

At block 610, parameters of a modified reset pulse to be applied to a particular memory cell may be established. For example, such parameters may comprise a value of peak current of a reset pulse, a width of a reset pulse, rise time of a reset pulse, and/or TET of a reset pulse. In a particular implementation, for example, a modified reset pulse may include a peak current that is relatively larger (e.g., 20% larger) than a peak current used in process 500. Such a modified reset pulse may also include a TET that is relatively longer than a fall time used in process 500. To illustrate a particular example, a modified reset pulse may include a peak current of 180 micro-amps and a TET of 50 ns for one memory cell, while a modified reset pulse for another memory cell may include a peak current of 240 micro-amps and a TET of 50 ns. Of course, these are merely examples of modified reset pulse parameters, and claimed subject matter is not limited in this respect. At block 620, a modified reset pulse having parameters determined at block 610 may be applied to a memory cell to write a "zero" bit to the memory cell, corresponding to a high-resistance state. In one implementation, such a "zero" bit stored in a memory cell may lead to a relatively low verify current as a result of applying a verify voltage across the memory cell, for example. In such a fashion, whether a "zero" bit was successfully written to the memory cell may be confirmed by determining whether or not a verify current is less than a particular threshold current value. In addition, whether or not a desired additional resistance margin 330 is associated with a "zero" bit may be confirmed by such a determination, which may be performed at diamond 630. If a verify current is less than a particular threshold current, then process 600 may end, since storage of a "zero" bit, corresponding to a relatively high resistance that includes an added resistance margin is verified. However, if a verify current is more than such a particular threshold current, then storage of a "zero" bit may have failed and/or memory cell resistance may be increased further as a result of applying a modified reset pulse that allows SR to occur, for example. Thus, process 600 may proceed to block 640 where TET of a modified reset pulse may be increased by a particular increment. For example, at block 640, a TET of 50 ns may be increased by an increment of 10 ns. Here, a TET including such an additional 10 ns applied to a memory cell may lead to an enhanced resistance value of the memory cell.

At diamond 650, a determination may be made as to whether or not a TET including a portion of time added at block 640 remains less than a particular TET value. If so, then process 600 may proceed to block 620 where a modified reset pulse having an increased TET may be applied to the memory cell. However, if a TET resulting from an increase performed at block 640 is not less than such a particular TET, then process 600 may proceed to block 660 where reset pulse parameters, in addition to TET, may be modified. For example, such parameters may comprise a time increment size at which TET is increased at block 640. In such a case, a resolution of the rate at which TET is increased at block 640 may be adjusted. Other parameters that may be adjusted at block 660 may include a value of peak current of the modified reset pulse, for example. Accordingly, various combinations of peak current and TET of a modified reset pulse may be subsequently applied to a memory cell. In particular, process 600 may proceed to block 620 where modified reset pulse having adjusted parameters may be applied to the memory cell. Such adjusted parameters may be sufficient to reset phase change material to a sufficiently enhanced high-resistance state. If so, then process 600 may end. Otherwise, if resistance of the memory cell is still not sufficiently high, then process 600 may again proceed to block 640 and TET of the modified reset pulse may be increased further. Such a process cycle may continue until a verify current is less than a threshold current, thus indicating that enhanced resistance of the memory cell is sufficiently high. Of course, such details of process 600 are merely examples, and claimed subject matter is not so limited.

Figure 7:
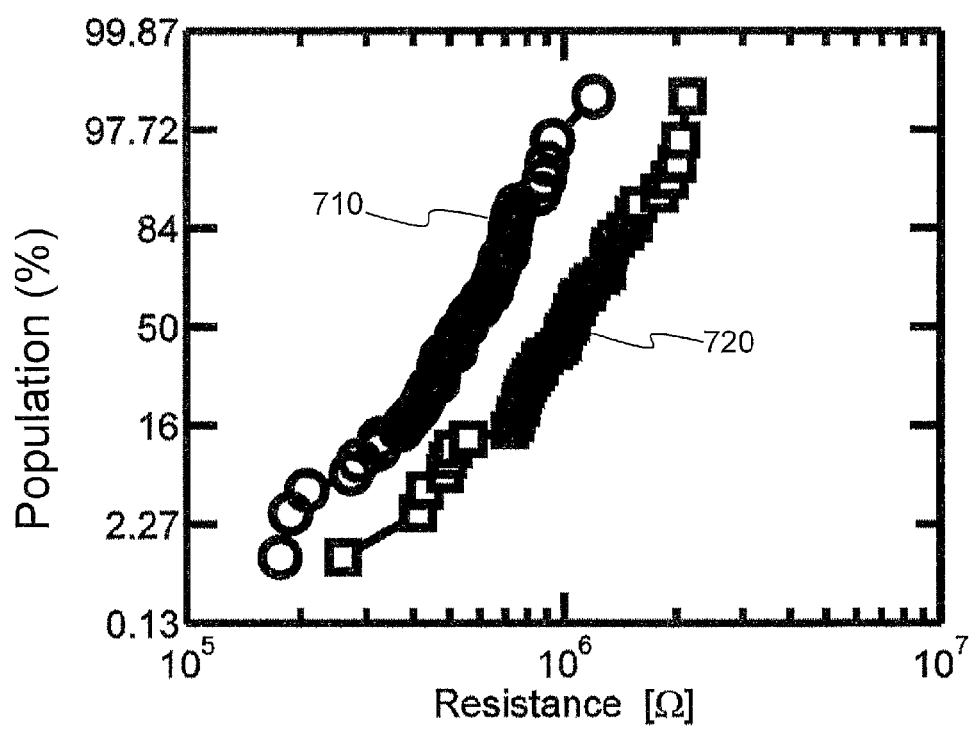
FIG. 7 is a plot showing a distribution of resistance of a memory cell, according to an embodiment.

FIG. 7 is a plot 700 showing a distribution of resistance of a memory cell, according to an embodiment. Data points 710 comprise resistance of a plurality of memory cells reset to a high-resistance state (e.g., "zero" bit). A process of resetting such memory cells may involve a reset pulse that does not include an added TET, for example. On the other hand, data points 720 show resistances of a plurality of memory cells reset to an enhanced high-resistance state. A process of resetting such memory cells may involve a modified reset pulse that includes an added TET, as described above, for example. Plot 700 may demonstrate that after the application of a modified reset pulse that includes an added TET, a higher resistance level of a memory cell may be obtained in comparison to a resistance level obtained by a reset pulse without an added TET. Of course, such details of plot 700 are merely examples, and claimed subject matter is not so limited.

Figure 8:
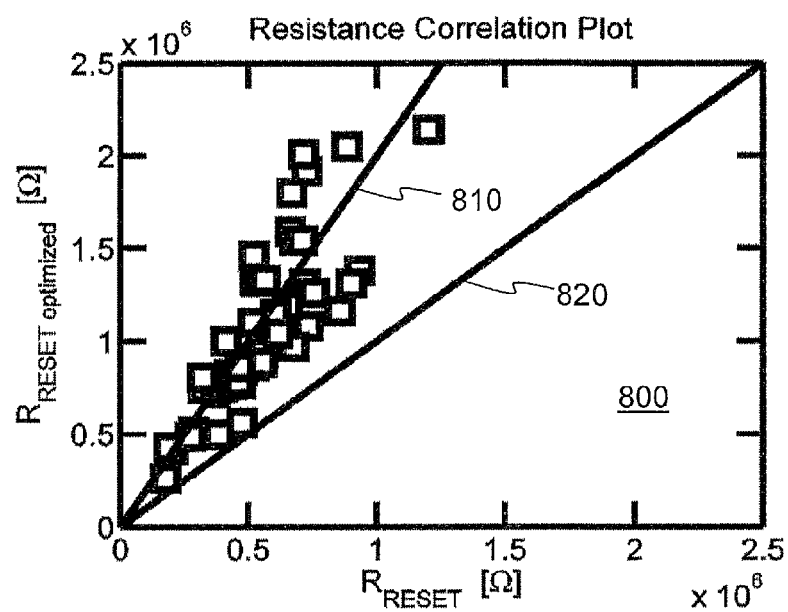
FIG. 8 is a plot showing a distribution of resistance of a memory cell, according to another embodiment.

FIG. 8 is a plot 800 showing a distribution of resistance of a memory cell, according to another embodiment. Plot 820 comprises values of resistance of memory cells reset to a high-resistance state (e.g., "zero" bit). A process of resetting such memory cells may involve a reset pulse that does not include an added TET, for example. On the other hand, data points 810 show resistances of a plurality of memory cells reset to an enhanced high-resistance state. A process of resetting such memory cells may involve a modified reset pulse that includes an added TET, as described above, for example. Plot 800 may demonstrate a correlation between resistance distributions shown in FIG. 7, and demonstrate that a modified reset pulse that includes an added TET may double a resistance level of a memory cell compared to resistance obtained from a reset pulse that lacks an added TET, for example. Of course, such details of plot 800 are merely examples, and claimed subject matter is not so limited.

Figure 9:
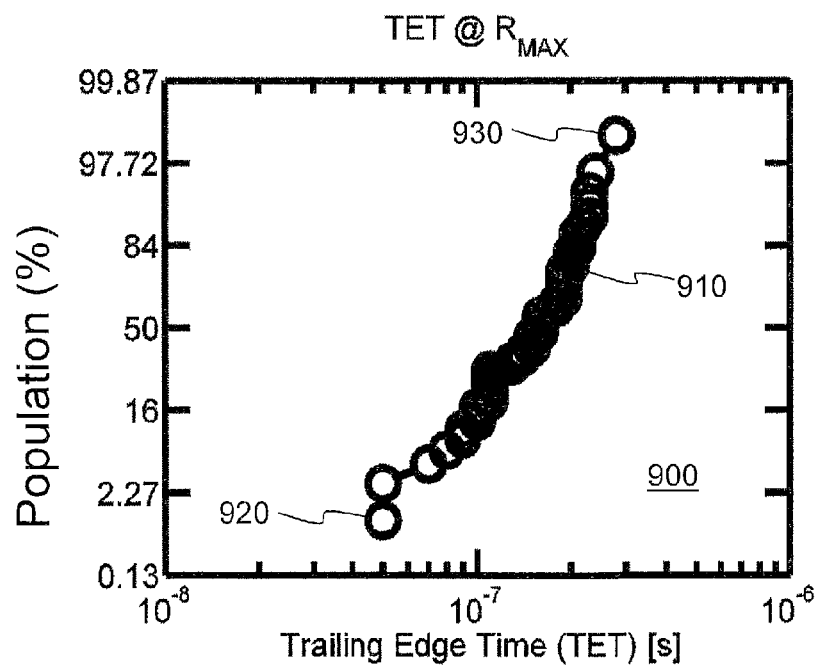
FIG. 9 is a plot showing a distribution of TET of a memory cell, according to an embodiment.

FIG. 9 is a plot 900 showing a distribution of TET of a memory cell, according to an embodiment. Data points 910 comprise a population of memory cells reset to an enhanced high-resistance state for various values of TET. For example, data point 920 may indicate that a relatively small percentage of memory cells achieves such an enhanced high-resistance state if TET is relatively short. In comparison, data point 930 may indicate that a relatively large percentage of memory cells achieves an enhanced high-resistance state if TET is relatively long. Of course, such details of plot 900 are merely examples of TETs for memory cells, and claimed subject matter is not so limited.

Figure 10:
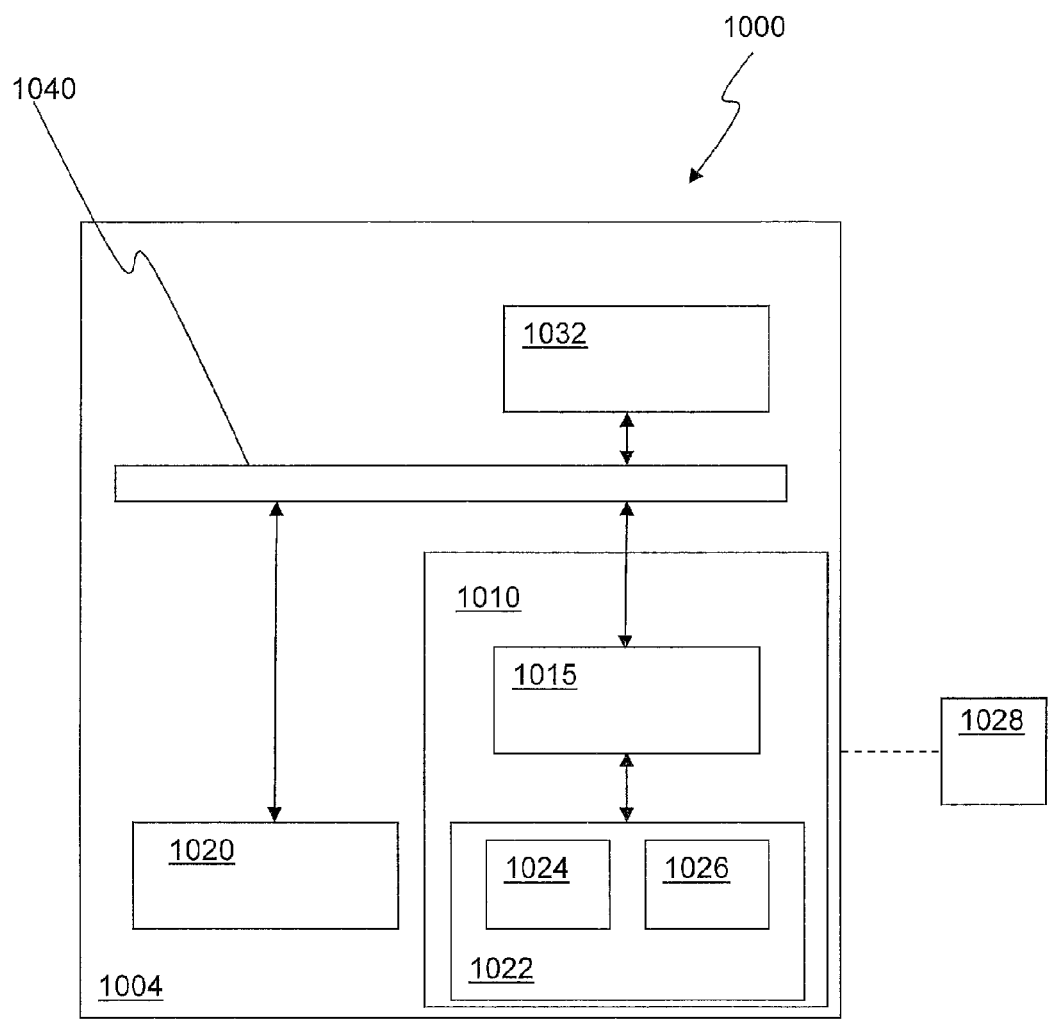
FIG. 10 is a schematic diagram illustrating an exemplary embodiment of a computing system.

FIG. 10 is a schematic diagram illustrating an exemplary embodiment of a computing system 1000 including a memory device 1010. Such a computing device may comprise one or more processors, for example, to execute an application and/or other code. For example, memory device 1010 may comprise a memory that includes PCM 100, shown in FIG. 1. A computing device 1004 may be representative of any device, appliance, or machine that may be configurable to manage memory device 1010. Memory device 1010 may include a memory controller 1015 and a memory 1022. By way of example but not limitation, computing device 1004 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 1000, and the processes and methods as further described herein, may be implemented using or otherwise including hardware, firmware, software, or any combination thereof. Thus, by way of example but not limitation, computing device 1004 may include at least one processing unit 1020 that is operatively coupled to memory 1022 through a bus 1040 and a host or memory controller 1015. Processing unit 1020 is representative of one or more circuits configurable to perform at least a portion of a data computing procedure or process. By way of example but not limitation, processing unit 1020 may include one or more processors, controllers, microprocessors, microcontrollers, application specific integrated circuits, digital signal processors, programmable logic devices, field programmable gate arrays, and the like, or any combination thereof. Processing unit 1020 may include an operating system configured to communicate with memory controller 1015. Such an operating system may, for example, generate commands to be sent to memory controller 1015 over bus 1040. Such commands may comprise read and/or write commands. In response to a write command, for example, memory controller 1015 may provide a reset pulse, such as modified reset pulse 420 comprising a TET 428, shown in FIG. 4, for example. In particular, memory controller 1015 may apply a modified reset pulse 420 to an array of PCM cells to place the PCM cells in a reset state; measure read currents associated with a high-resistance reset state of the PCM cells; compare the read currents with a particular reference current; and apply a modified reset pulse individually to the PCM cells to place the PCM cells in a higher-resistance state, wherein the modified reset pulse includes an added TET in response to the comparing.

Memory 1022 is representative of any data storage mechanism. Memory 1022 may include, for example, a primary memory 1024 and/or a secondary memory 1026. Primary memory 1024 may include, for example, a random access memory, read only memory, etc. While illustrated in this example as being separate from processing unit 1020, it should be understood that all or part of primary memory 1024 may be provided within or otherwise co-located/coupled with processing unit 1020.

Secondary memory 1026 may include, for example, the same or similar type of memory as primary memory and/or one or more data storage devices or systems, such as, for example, a disk drive, an optical disc drive, a tape drive, a solid state memory drive, etc. In certain implementations, secondary memory 1026 may be operatively receptive of, or otherwise configurable to couple to, a computer-readable medium 1028. Computer-readable medium 1028 may include, for example, any medium that can carry and/or make accessible data, code, and/or instructions for one or more of the devices in system 1000.

Computing device 1004 may include, for example, an input/output 1032. Input/output 1032 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 1032 may include an operatively configured display, speaker, keyboard, mouse, trackball, touch screen, data port, etc.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method, comprising:
    applying a first electrical signal to a memory cell for programming the memory cell to a resistance state;
    comparing a current value of a test signal applied to the memory cell to a threshold current value;
    determining a fall time associated with a second electrical signal based at least in part on the comparing; and
    applying the second electrical signal to the memory cell for programming the memory cell to an increased resistance state, wherein the second electrical signal comprises an added trailing edge time relative to the first electrical signal based at least in part on the determining, and wherein the fall time of the second electrical signal is greater than a rise time of the second electrical signal.

2. The method of claim 1, wherein programming the memory cell to the resistance state comprises programming the memory cell to a reset state, and wherein the increased resistance state comprises a resistance higher than that of the reset state.

3. The method of claim 1, wherein the second electrical signal comprises a magnitude greater than a magnitude of the first electrical signal.

4. The method of claim 1, further comprising determining a resistance value of the resistance state and comparing the resistance value to a reference resistance value, wherein applying the second electrical signal is performed in response to the resistance value being lower than the reference resistance value.

5. The method of claim 1, wherein applying the second electrical signal comprising the added trailing edge time further comprises adjusting the trailing edge time of the second electrical signal, wherein the adjusted trailing edge time comprises a duration shorter than a threshold time value beyond which the resistance state of the memory cell is not achieved.

6. The method of claim 1, further comprising subsequently applying a plurality of additional electrical signals to the memory cell for programming the memory cell, and wherein each of the plurality of additional electrical signals comprises a corresponding trailing edge time having a duration longer than that of an immediately previously applied electrical signal.

7. The method of claim 6, wherein each of the plurality of additional electrical signals comprises a magnitude substantially equal to a magnitude of the second electrical signal.

8. The method of claim 7, wherein each of the plurality of additional electrical signals comprises a voltage signal, and wherein the magnitude of each of the plurality of additional electrical signals comprises a peak voltage value.

9. A memory device, comprising:
    a memory array comprising a memory cell, wherein the memory cell comprises phase change memory; and a memory controller configured to:
  apply a first electrical signal to the memory cell for programming the memory cell to a resistance state;
  compare a current value of a test signal applied to the memory cell and a threshold current value;
  determine a fall time associated with a second electrical signal based at least in part on the comparing; and
  apply the second electrical signal to the memory cell for programming the memory cell to an increased resistance state, wherein the second electrical signal comprises an added trailing edge time relative to the first electrical signal based at least in part on the determining, and wherein the fall time of the second electrical signal is greater than a rise time of the second electrical signal.

10. The memory device of claim 9, wherein the resistance state of the memory cell comprises a reset state.

11. The memory device of claim 9, wherein each of the first electrical signal and the second electrical signal comprises a voltage signal, and wherein the memory controller is further configured to apply the second electrical signal comprising a peak voltage value greater than a peak voltage value of the first electrical signal.

12. The memory device of claim 9, wherein the added trailing edge time is less than 120 nanoseconds.

13. The memory device of claim 9, wherein the memory controller is further configured to apply to the memory cell a third electrical signal, wherein the third electrical signal comprises a trailing edge time having a duration greater than a duration of the added trailing edge time.

14. The memory device of claim 13, further comprising verifying a resistance value of the memory cell subsequent to applying the second electrical signal, wherein the memory controller is configured to apply the third electrical signal in response to the resistance value of the memory cell being less than a threshold resistance value.

15. The memory device of claim 14, wherein the threshold resistance value is greater than a resistance value corresponding to a reset state.

16. A system, comprising:
  a memory array comprising a memory cell, wherein the memory cell comprises phase change memory;
  a memory controller configured to program the memory cell in response to a write command, wherein the memory controller is configured to program the memory cell by:
    applying a first electrical signal to the memory cell for programming the memory cell to a resistance state;
    comparing a current value of a test signal applied to the memory cell and a threshold current value;
    determining a fall time associated with a second electrical signal based at least in part on the comparing; and
    applying the second electrical signal to the memory cell for programming the memory cell to an increased resistance state, wherein the second electrical signal comprises an added trailing edge time relative to the first electrical signal based at least in part on the determining, and wherein the fall time of the second electrical signal is greater than a rise time of the second electrical signal; and
  a processor configured to initiate the write command for accessing the memory array.

17. The system of claim 16, wherein the resistance state of the memory cell comprises a reset state and the increased resistance state comprises a modified reset state, wherein the modified reset state comprises a resistance value higher than a resistance value of the reset state.

18. The system of claim 16, wherein the memory controller is further configured to subsequently apply a plurality of electrical signals to the memory cell, wherein each of the plurality of electrical signals comprises a corresponding trailing edge time, and wherein each of the corresponding trailing edge times comprises a duration greater than a duration of an immediately previously applied trailing edge time.

19. The system of claim 18, wherein the duration of each of the corresponding trailing edge times is shorter than a threshold duration.

20. The system of claim 16, wherein the second electrical signal comprises a magnitude greater than a magnitude of the first electrical signal.

* * * * *